US012185497B2

(12) United States Patent
Liu et al.

(10) Patent No.: US 12,185,497 B2
(45) Date of Patent: Dec. 31, 2024

(54) FLUID IMMERSION COOLING SYSTEM WITH LOW FLASH POINT HYDROCARBON DIELECTRIC FLUID

(71) Applicant: Super Micro Computer, Inc., San Jose, CA (US)

(72) Inventors: Yueh-Ming Liu, New Taipei (TW); Hsiao-Chung Chen, New Taipei (TW); Chia-Wei Chen, New Taipei (TW); Yu-Hsiang Huang, New Taipei (TW); Chia-Che Chang, New Taipei (TW); Hua-Kai Tong, New Taipei (TW); Tan-Hsin Chang, New Taipei (TW); Yu-Chuan Chang, New Taipei (TW); Ming-Yu Chen, New Taipei (TW); Yu-Yen Hsiung, New Taipei (TW); Kun-Chieh Liao, Taoyuan (TW)

(73) Assignee: Super Micro Computer, Inc., San Jose, CA (US)

(*) Notice: Subject to any disclaimer, the term of this patent is extended or adjusted under 35 U.S.C. 154(b) by 340 days.

(21) Appl. No.: 17/891,563

(22) Filed: Aug. 19, 2022

(65) Prior Publication Data

US 2024/0064936 A1    Feb. 22, 2024

(51) Int. Cl.
 *H05K 7/20* (2006.01)
 *A62C 3/16* (2006.01)
 *A62C 99/00* (2010.01)

(52) U.S. Cl.
 CPC .............. *H05K 7/203* (2013.01); *A62C 3/16* (2013.01); *A62C 99/0018* (2013.01); *A62C 99/0027* (2013.01); *H05K 7/20327* (2013.01); *H05K 7/20381* (2013.01)

(58) Field of Classification Search
 CPC .. H05K 7/2029; H05K 7/203; H05K 7/20327; H05K 7/20381; A62C 3/16; A62C 99/0018; A62C 99/0027
 See application file for complete search history.

(56) References Cited

U.S. PATENT DOCUMENTS

| | | | |
|---|---|---|---|
| 6,341,572 B1* | 1/2002 | Howell | A62C 99/0018 166/356 |
| 9,049,800 B2 | 6/2015 | Shelnutt et al. | |
| 9,195,282 B2 | 11/2015 | Shelnutt et al. | |
| 9,335,802 B2 | 5/2016 | Shelnutt et al. | |
| 9,351,429 B2 | 5/2016 | Shelnutt et al. | |
| 9,464,854 B2 | 10/2016 | Shelnutt et al. | |
| 10,018,425 B2 | 7/2018 | Shelnutt et al. | |
| 10,184,699 B2 | 1/2019 | Shedd et al. | |
| 11,820,951 B2* | 11/2023 | Kurth | C10M 169/04 |

(Continued)

*Primary Examiner* — Joel M Attey
(74) *Attorney, Agent, or Firm* — Beyer Law Group LLP

(57) ABSTRACT

A fluid immersion cooling system has a fluid tank containing a hydrocarbon dielectric fluid as a coolant fluid. One or more components of an electronic system is immersed in the coolant fluid. A gas cylinder contains a non-flammable, compressed filling gas. The temperature of the coolant fluid is monitored during operation of the electronic system. The filling gas is released from the gas cylinder and into the fluid tank when the temperature of the coolant fluid rises to a trigger temperature that is set based on the flash point of the coolant fluid. The filling gas covers a surface of the coolant fluid to block oxygen from interacting with vapors of the coolant fluid to prevent combustion.

17 Claims, 7 Drawing Sheets

(56) References Cited

U.S. PATENT DOCUMENTS

2016/0234970 A1    8/2016  Shelnutt et al.
2020/0205318 A1*  6/2020  Hulse ................ H05K 7/20809
2020/0305310 A1*  9/2020  Alissa .................. H05K 7/203

* cited by examiner

FLUID IMMERSION COOLING SYSTEM WITH LOW FLASH POINT HYDROCARBON DIELECTRIC FLUID

TECHNICAL FIELD

The present disclosure is directed to fluid immersion cooling of electronic systems.

BACKGROUND

Electronic systems, such as computers, routers, packet switches, cellular circuits, etc., generate heat during operation. Cooling systems have been developed to prevent electronic systems from overheating. A simple cooling system involves the use of cooling fans to move heat away from components of the electronic system. A fluid immersion cooling system, on the other hand, involves immersing components of the electronic system in a coolant fluid.

Examples of dielectric coolant fluids that are commonly-used in fluid immersion cooling systems include fluorochemicals and hydrocarbons. Fluorochemicals impart stability and inertness but are relatively expensive and have a high Global Warming Potential (GWP). That is, fluorochemicals produce greenhouse effects that are bad for the environment. Hydrocarbons, also referred to as "oils", are more common and economical relative to fluorochemicals. However, hydrocarbons are combustible and thus pose safety concerns.

BRIEF SUMMARY

In one embodiment, a fluid immersion cooling system comprises a fluid tank, a coolant fluid comprising a hydrocarbon dielectric fluid in the fluid tank, and a gas cylinder storing a filling gas. The filling gas (e.g., carbon dioxide) is a non-flammable gas with a specific gravity that is greater than that of air and oxygen. One or more components of an electronic system are immersed in the coolant fluid. A valve that caps the gas cylinder is opened to release the filling gas from the gas cylinder and into the fluid tank when a temperature of the coolant fluid rises to a trigger temperature during operation of the electronic system. The trigger temperature is set based on a flash point of the coolant fluid. Upon release from the gas cylinder, the filling gas covers a surface of the coolant fluid to block oxygen from interacting with vapors of the coolant fluid.

In another embodiment, a method of fluid immersion cooling of an electronic system includes filling a fluid tank with a coolant fluid comprising a hydrocarbon dielectric fluid. One or more components of an electronic system are immersed in the coolant fluid. A temperature of the coolant fluid is monitored during operation of the electronic system. A non-flammable filling gas (e.g., carbon dioxide) with a specific gravity that is greater than that of air and oxygen is released into the fluid tank to cover a surface of the coolant fluid when the temperature of the coolant fluid is equal to or higher than a trigger temperature that is set based on a flash point of the coolant fluid. The filling gas covers the surface of the coolant fluid to block oxygen from interacting with vapors of the coolant fluid.

These and other features of the present disclosure will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The drawings are not to scale.

DETAILED DESCRIPTION

In the present disclosure, numerous specific details are provided, such as examples of apparatus, materials, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Flash point is the minimum temperature at which a liquid forms a vapor above its surface in sufficient concentration that it can be ignited. The flash point of a hydrocarbon dielectric fluid thus provides an indication of its combustibility. Accordingly, for safety reasons, it is advantageous to use hydrocarbon dielectric fluids with a high flash point in fluid immersion cooling systems. Unfortunately, the viscosity of a hydrocarbon dielectric fluid tends to increase with its flash point. That is, the higher the flash point, the higher the viscosity. In a fluid immersion cooling system, high viscosity coolant fluids necessitate relatively large cooling distribution equipment (e.g., pumps, radiators, heat exchangers) to improve fluid flow and heat dissipation capacity, thereby increasing the total cost of ownership (including capital and operational expenditures) of the fluid immersion cooling system.

Embodiments of the present invention address safety issues relating to the use of low flash point hydrocarbon dielectric fluids in an immersion cooling system. For purposes of the present disclosure, a low flash point hydrocarbon dielectric fluid has a flash point that is lower than 250° C. For example, a low flash point hydrocarbon dielectric fluid may have a flash point that is between 150° C. and 250° C. However, by preventing vapors of a hydrocarbon dielectric fluid from interacting with oxygen, embodiments of the present invention may be employed with hydrocarbon dielectric fluids having a wide range of flash points.

Figure 1:
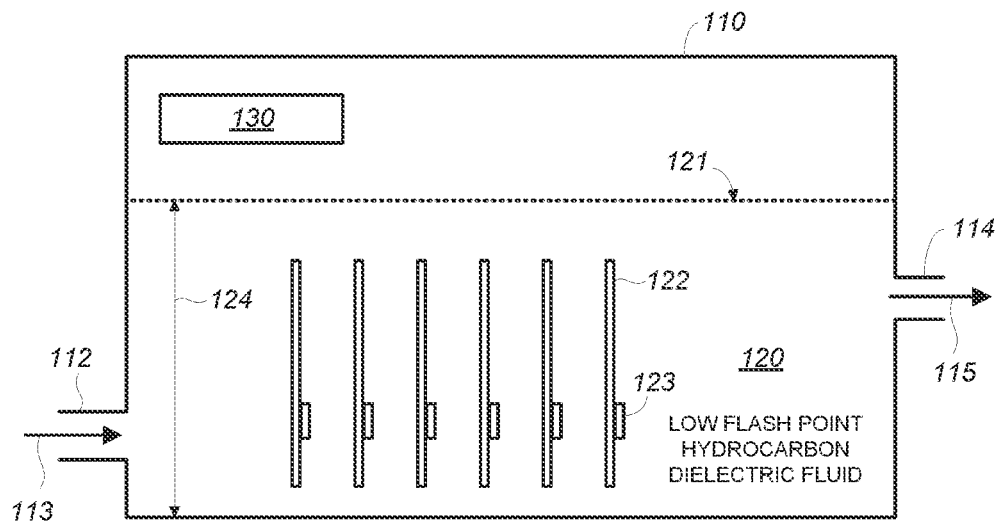
FIG. 1 shows a schematic diagram of a fluid immersion cooling system in accordance with an embodiment of the present invention.

FIG. 1 shows a schematic diagram of a fluid immersion cooling system in accordance with an embodiment of the present invention. The fluid immersion cooling system includes a fluid tank 110 that is filled with a coolant fluid 120. In one embodiment, the coolant fluid 120 comprises a single-phase, low flash point hydrocarbon dielectric fluid. For example, the coolant fluid 120 may be the EC-100, EC-110, or EC-120 coolant fluid of Engineered Fluids, Inc. or the PAO 2, PAO 2.5, or PAO 4 coolant fluid of the Chevron Phillips Chemical Company. Other single-phase, low flash point hydrocarbon dielectric fluids that are commonly used as coolant fluids in fluid immersion cooling systems may also be employed.

In the example of FIG. 1, the coolant fluid 120 fills the fluid tank 110 to a depth 124 that is sufficient to submerge a plurality of substrates 122, which are components of an electronic system. The substrates 122 contain or support electronic devices 123. Note that only one substrate 122 and one electronic device 123 are labeled for clarity of illustration. The substrates 122 may comprise printed circuit boards or other substrates of an electronic system. The electronic devices 123 are examples of heat spots, which are regions or components on the substrates 122 that generate a lot of heat. An electronic device 123 may be a Central Processing Unit (CPU), Graphics Processing Unit (GPU), power transistor, Field Programmable Gate Array (FPGA), etc. A dash line represents a top surface 121 of the coolant fluid 120 in the fluid tank 110.

The substrates 122, being components of an electronic system, may be electrically interconnected by a motherboard, cables, etc. These interconnection components are not shown for clarity of illustration. During operation of the electronic system, the electronic devices 123 are powered ON and generate heat. Heat from the electronic devices 123 and other regions of the substrates 122 that are immersed in the coolant fluid 120 is transferred to the coolant fluid 120.

The fluid tank 110 includes an inlet 112 and an outlet 114. Cooling distribution equipment (not shown in FIG. 1) may supply cold coolant fluid 120 to the fluid tank 110 through the inlet 112 (see arrow 113). Hot coolant fluid 120 flows out of the fluid tank 110 through the outlet 114 (see arrow 115) to be cooled by the cooling distribution equipment. The cooling distribution equipment (e.g., see FIGS. 9 and 10) may include pumps, manifolds, radiators, heat-exchangers, etc. for cooling the coolant fluid 120.

The fluid tank 110 may have a completely or partially open top. Even with a closed top (e.g., with faceplates of components of the electronic system), it is very difficult to completely seal the fluid tank 110. Oxygen is thus present above the surface 121. When the temperature of the coolant fluid 120 reaches its flash point, hydrocarbon vapors of the coolant fluid 120 can potentially interact with the oxygen to cause a combustion in the fluid tank 110. Generally, combustion in the fluid tank 110 requires a combustible coolant, oxygen, and high temperature. As will be more apparent below, embodiments of the present invention prevent oxygen from interacting with the combustible coolant at temperatures that are high enough to cause a combustion.

In the example of FIG. 1, the fluid immersion cooling system includes a suppression unit 130 that is configured to release a filling gas (e.g., carbon dioxide) into the fluid tank 110 when the temperature of the coolant fluid 120 reaches a trigger temperature, which is set based on the flash point of the coolant fluid 120. The trigger temperature is set higher than the maximum operating temperature of the coolant fluid 120 (e.g., about 40° C. to 60° C.) but lower than the flash point of the coolant fluid 120. Generally, the trigger temperature may be set to about 80% of the flash point. As a particular example, if the flash point is 150° C., the trigger temperature may be set to 120° C. As can be appreciated, the trigger temperature may be optimized to meet the needs of a particular application.

When the temperature of the coolant fluid 120 reaches the trigger temperature, the suppression unit 130 releases the filling gas to cover the surface 121 of the coolant fluid 120, thereby preventing combustion by blocking oxygen from interacting with vapors of the coolant fluid 120. Preferably, the filling gas is non-flammable, compressed, has a specific gravity that is greater than that of air and oxygen ($O_2$), and has no biological toxicity. In one embodiment, the filling gas comprises carbon dioxide ($CO_2$).

Figure 2:
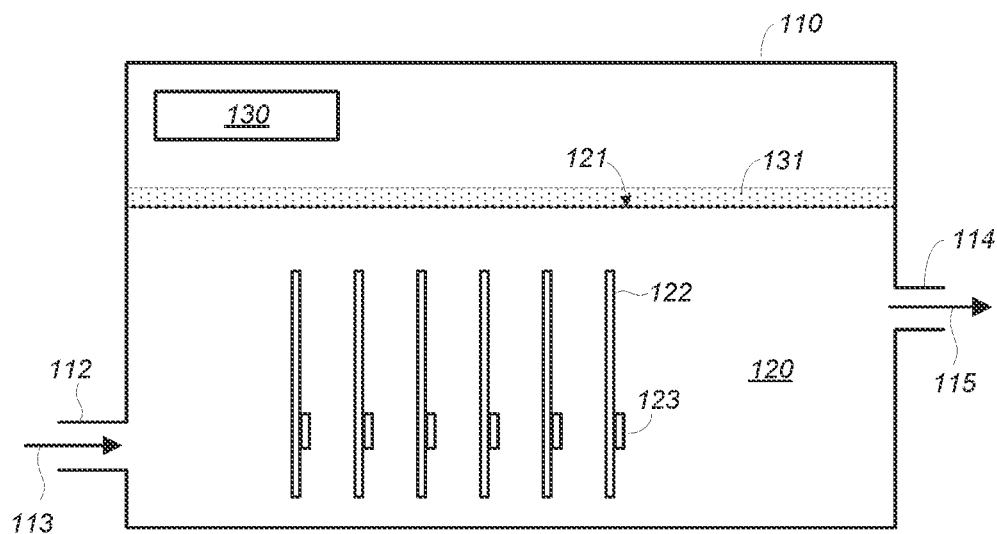
FIG. 2 schematically shows the fluid immersion cooling system of FIG. 1 after a filling gas is released in the fluid tank, in accordance with an embodiment of the present invention.

FIG. 2 schematically shows the fluid immersion cooling system of FIG. 1 after the suppression unit 130 released the filling gas into the fluid tank 110 in response to the temperature of the coolant fluid 120 rising to the trigger temperature. Because the specific gravity of the filling gas (e.g., carbon dioxide) is greater than that of air and oxygen, air and oxygen will be squeezed out of the fluid tank 110, thereby leaving the filling gas to cover the top surface 121 of the coolant fluid 120. The cover of filling gas (see FIG. 2, 131) prevents hydrocarbon vapors of the coolant fluid 120 from interacting with the oxygen above the surface 121.

The suppression unit 130 is schematically depicted as being in the fluid tank 110 and out of the coolant fluid 120. As can be appreciated, one or more components of the suppression unit 130 may be placed in different locations, including outside the fluid tank 110, in the coolant fluid 120, etc. In light of the present disclosure, one of ordinary skill in the art will appreciate that the suppression unit 130 may be implemented a variety ways as now explained beginning with FIG. 3.

Figure 3:
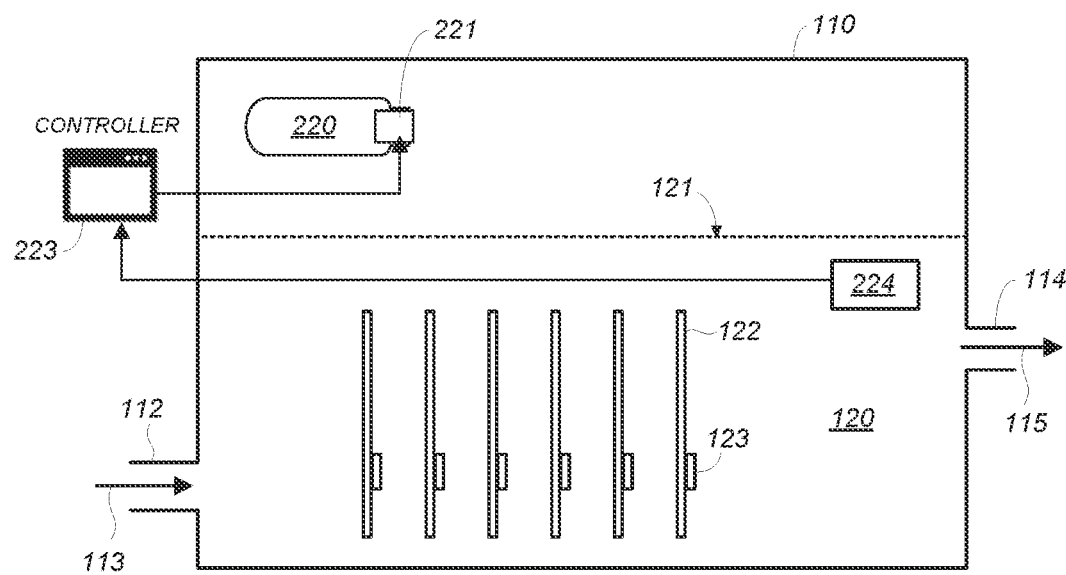
FIG. 3 shows a schematic diagram of a fluid immersion cooling system with an electronic control valve in accordance with an embodiment of the present invention.

FIG. 3 shows a schematic diagram of a fluid immersion cooling system with an electronic control valve in accordance with an embodiment of the present invention. The fluid immersion cooling system of FIG. 3 is a particular embodiment of that of FIG. 1, with the suppression unit 130 being implemented using a gas cylinder 220 that is capped by an electronic control valve 221, a temperature sensor 224, and a controller 223. The fluid immersion cooling systems of FIGS. 1 and 3 are otherwise the same.

The gas cylinder 220 contains a compressed filling gas (e.g., carbon dioxide) as explained above with reference to FIG. 1. During normal operation, the control valve 221 is in the closed position to prevent the filling gas from escaping into the fluid tank 110. It is to be noted that the gas cylinder 220 does not need to be located within the fluid tank 110. For example, the gas cylinder 220 may be located outside the fluid tank 110, with a gas line (not shown) connecting the gas cylinder 220 to the fluid tank 110.

The control valve 221 is electrically-connected to the controller 223. The temperature sensor 224, which is also electrically-connected to the controller 223, is immersed in the coolant fluid 120 to measure the temperature of the coolant fluid 120. The controller 223 may be a programmable logic controller (PLC), microcontroller, personal computer, or other controller commonly-employed in industrial process control applications. The controller 223 is configured to actuate the control valve 221, to an open or closed position, based on the temperature reading provided by the temperature sensor 224.

Figure 4:
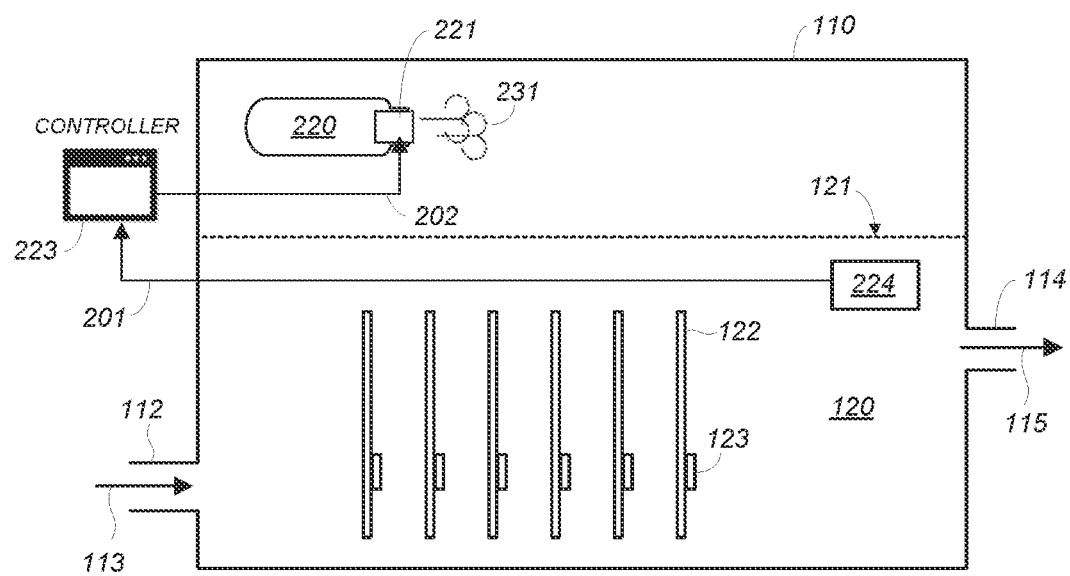
FIG. 4 schematically shows the fluid immersion cooling system of FIG. 3 when the temperature of the coolant fluid rises to the trigger temperature, in accordance with an embodiment of the present invention.

FIG. 4 schematically shows the fluid immersion cooling system of FIG. 3 when the temperature of the coolant fluid 120 rises to the trigger temperature. The controller 223 is configured to receive, from the temperature sensor 224, temperature readings of the coolant fluid 120 (see arrow 201). When the temperature of the coolant fluid 120 is equal to or higher than the trigger temperature, the controller 223 is configured to actuate the control valve 221 (see arrow 202) to an open position, thereby releasing the filling gas (shown as 231 in FIG. 4) from the gas cylinder 220 and into the fluid tank 110.

Figure 5:
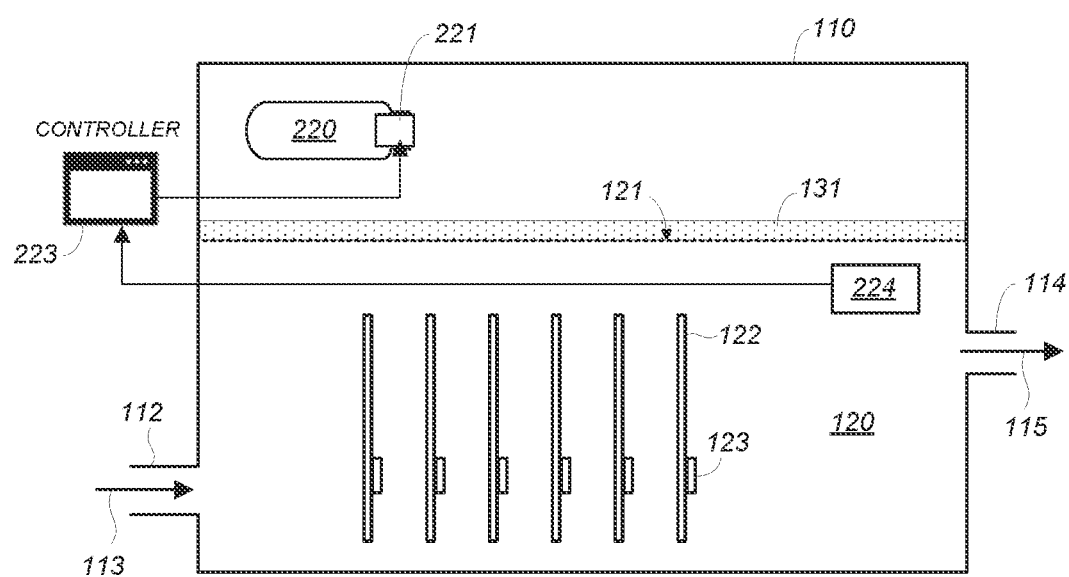
FIG. 5 schematically shows the fluid immersion cooling system of FIG. 3 after release of the filling gas from the gas cylinder and into the fluid tank, in accordance with an embodiment of the present invention.

FIG. 5 schematically shows the fluid immersion cooling system of FIG. 3 after release of the filling gas from the gas cylinder 220 and into the fluid tank 110. The filling gas covers the surface 121 of the coolant fluid 120 (see FIG. 5, 131). The filling gas prevents combustion in the fluid tank 110 by blocking oxygen above the surface 121 from interacting with vapors of the coolant fluid 120.

Figure 6:
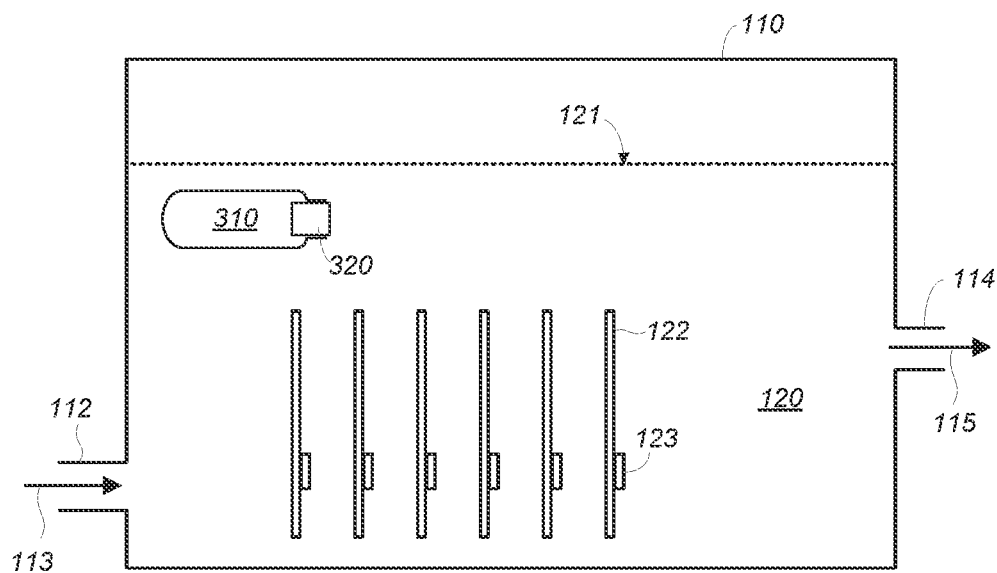
FIG. 6 shows a schematic diagram of a fluid immersion cooling system with a thermostatic control valve in accordance with an embodiment of the present invention.

FIG. 6 shows a schematic diagram of a fluid immersion cooling system with a thermostatic control valve in accordance with an embodiment of the present invention. The fluid immersion cooling system of FIG. 6 is a particular embodiment of that of FIG. 1, with the suppression unit 130 being implemented using a gas cylinder 310 that is capped by a thermostatic control valve 320. The fluid immersion cooling systems of FIGS. 1 and 6 are otherwise the same.

The gas cylinder 310 contains a compressed filling gas as previously described. The thermostatic control valve 320 is normally in the closed state to prevent the filling gas from escaping. The thermostatic control valve 320, which is immersed in the coolant fluid 120, is internally actuated based on the temperature of the coolant fluid 120. The thermostatic control valve 320 may comprise a hot-melt material that melts at a predetermined temperature, which in one embodiment is the trigger temperature. The melting of the hot-melt material opens the thermostatic control valve 320, thereby releasing the filling gas from the gas cylinder 310. The hot-melt material (e.g., a wax) may be selected such that it is not soluble in and does not chemically react with the coolant fluid 120. Other types of thermostatic control valves may also be employed.

Figure 7:
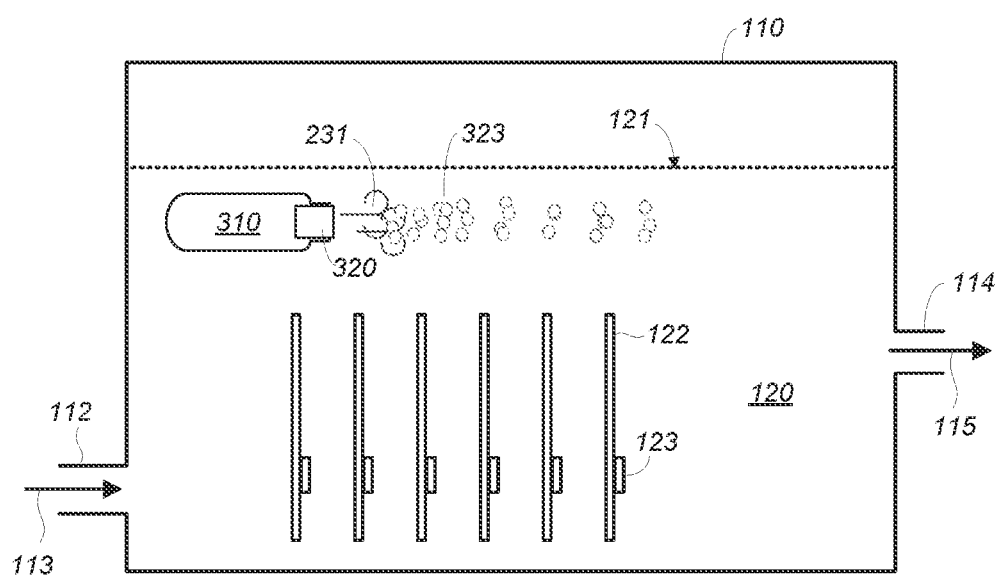
FIG. 7 schematically shows the fluid immersion cooling system of FIG. 6 when the temperature of the coolant fluid rises to the trigger temperature, in accordance with an embodiment of the present invention.

FIG. 7 schematically shows the fluid immersion cooling system of FIG. 6 when the temperature of the coolant fluid 120 rises to the trigger temperature, thereby opening the thermostatic control valve 320 and releasing the filling gas from the gas cylinder 310 into the fluid tank 110. Bubbles 323 are formed by the release of the filling gas (labeled as 231 in FIG. 7) in the coolant fluid 120.

Figure 8:
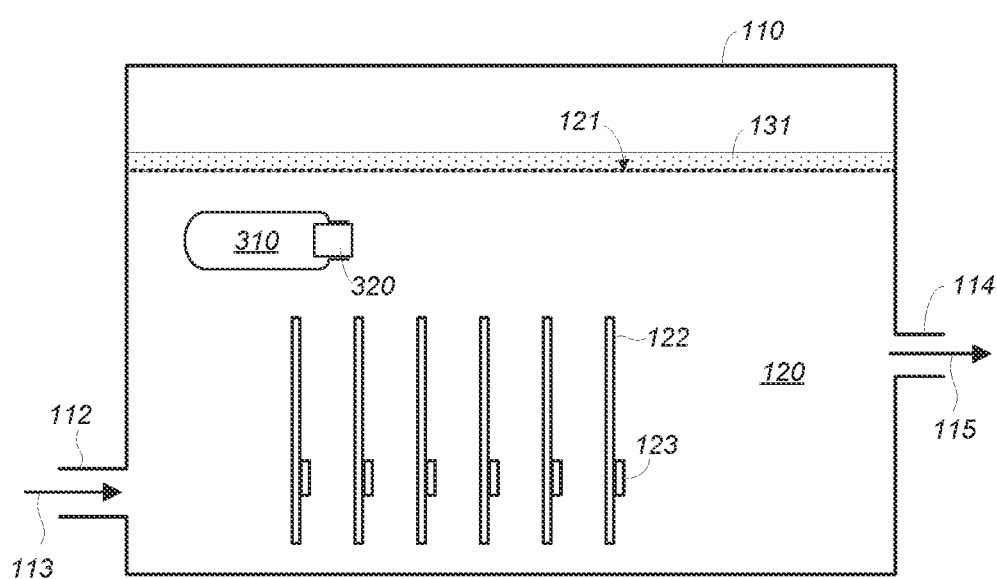
FIG. 8 schematically shows the fluid immersion cooling system of FIG. 6 after release of the filling gas from the gas cylinder and into the fluid tank, in accordance with an embodiment of the present invention.

FIG. 8 schematically shows the fluid immersion cooling system of FIG. 6 after release of the filling gas from the gas cylinder 310. The filling gas covers the surface 121 of the coolant fluid 120 (see FIG. 8, 131). The filling gas prevents combustion in the fluid tank 110 by blocking oxygen above the surface 121 from interacting with vapors of the coolant fluid 120.

Figure 9:
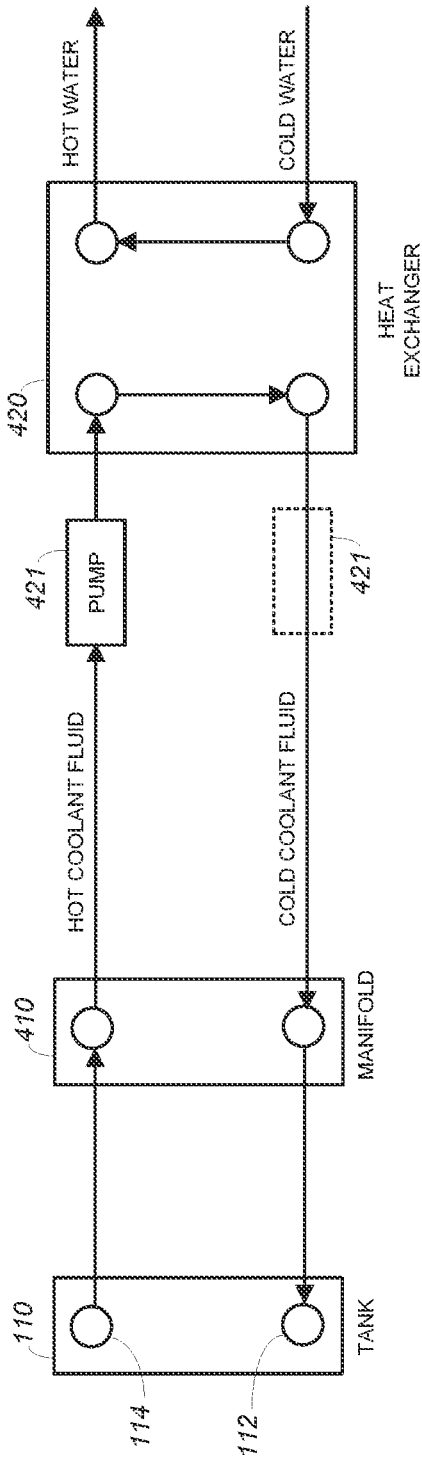
FIG. 9 shows a schematic diagram of a fluid immersion cooling system with a heat exchanger in accordance with an embodiment of the present invention.

The fluid immersion cooling systems disclosed herein may include a variety of cooling distribution equipment as now explained beginning with FIG. 9.

FIG. 9 shows a schematic diagram of a fluid immersion cooling system with a heat exchanger in accordance with an embodiment of the present invention. In the example of FIG. 9, the fluid tank 110 is connected to cooling distribution equipment comprising a manifold 410, one or more pumps 421, and a heat exchanger 420 (e.g., plate heat exchanger). A pump 421 may be disposed on the hot-side (as shown in FIG. 9), cold-side, or both sides (see FIG. 9, additional pump 421 represented by dashed lines) of the plumbing between the fluid tank 110 and the heat exchanger 420. In operation, the pump 421 circulates the coolant fluid 120 through the fluid tank 110, the manifold 410, and the heat exchanger 420. Cold coolant fluid 120 enters the fluid tank 110 through the inlet 112 (see also FIG. 1, 112) and hot coolant fluid 120 exits the fluid tank 110 through the outlet 114 (see also FIG. 1, 114). The manifold 410 facilitates cooling of the coolant fluid 120. The heat exchanger 420 further cools the coolant fluid 120 using cold water provided by an external cold water supply (not shown).

Figure 10:
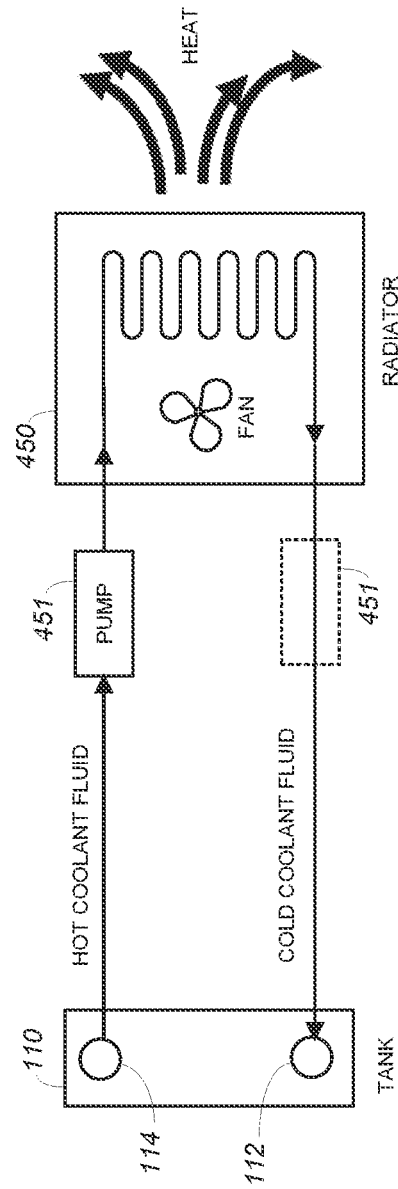
FIG. 10 shows a schematic diagram of a fluid immersion cooling system with a radiator in accordance with an embodiment of the present invention.

FIG. 10 shows a schematic diagram of a fluid immersion cooling system with a radiator in accordance with an embodiment of the present invention. In the example of FIG. 10, the fluid tank 110 is connected to cooling distribution equipment comprising one or more pumps 451 and a radiator 450. A pump 451 may be disposed on the hot-side (as shown in FIG. 10), cold-side, or both sides (see FIG. 10, additional pump 451 represented by dashed lines) of the plumbing between the fluid tank 110 and the radiator 450. In operation, the pump 451 circulates the coolant fluid 120 through the fluid tank 110 and the radiator 450. Cold coolant fluid 120 enters the fluid tank 110 through the inlet 112 (see also FIG. 1, 112) and hot coolant fluid 120 exits the fluid tank 110 through the outlet 114 (see also FIG. 1, 114). Hot coolant fluid 120 enters the radiator 450 to be cooled. A fan generates a stream of air that moves heat away from the cooling surfaces of the radiator 450.

Figure 11:
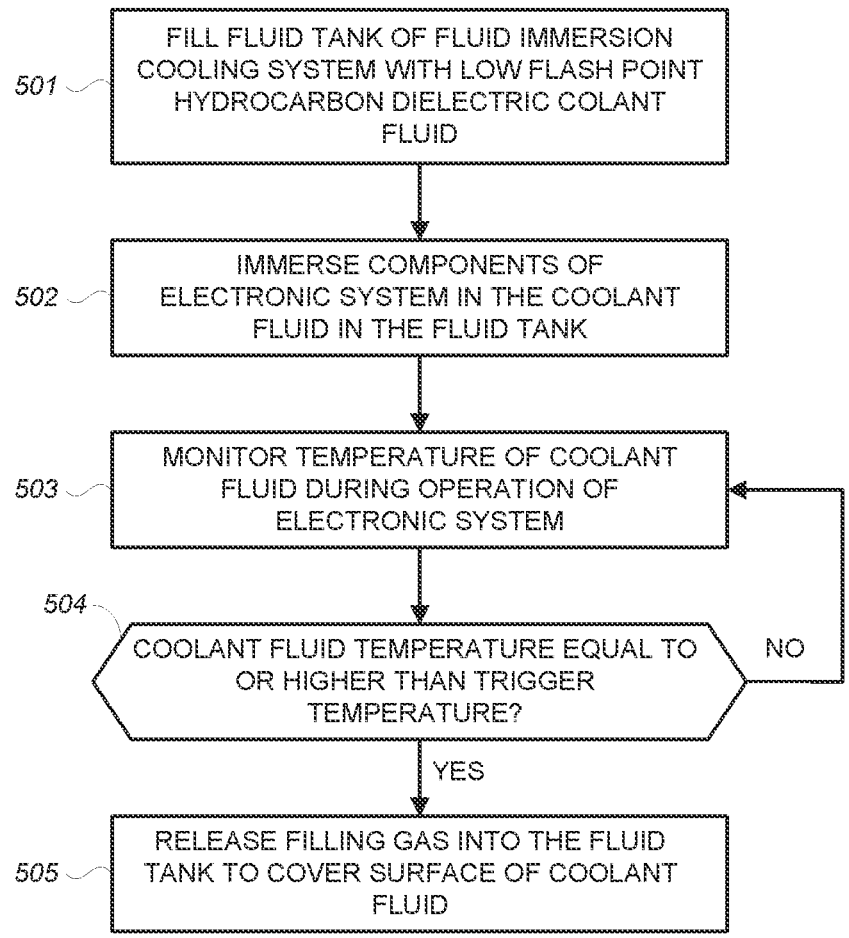
FIG. 11 shows a flow a diagram of a method of fluid immersion cooling of electronic systems in accordance with an embodiment of the present invention.

FIG. 11 shows a flow a diagram of a method of fluid immersion cooling of electronic systems in accordance with an embodiment of the present invention. The method of FIG. 11 is explained using components of the above-described fluid immersion cooling systems. As can be appreciated, other components may also be employed without detracting from the merits of the present invention.

In step 501, a fluid tank is filled with a coolant fluid comprising a low flash point hydrocarbon dielectric fluid. In step 502, one or more components of an electronic system are immersed in the coolant fluid in the fluid tank. For example, the electronic system may be a computer system, with the one or more components being motherboards with electronic devices of the computer system. In step 503, the temperature of the coolant fluid is monitored during operation of the electronic system. For example, the monitoring of the temperature of the coolant fluid may be performed using a temperature sensor. As another example, the monitoring of the temperature of the coolant fluid may be performed by a thermostatic control valve that is immersed in the coolant fluid.

In step 504 to step 503, the monitoring of the temperature of the coolant fluid continues when the temperature of the coolant fluid is not equal to or higher than a trigger temperature. The trigger temperature is set based on the flashpoint of the coolant fluid.

In step 504 to step 505, a filling gas is released into the fluid tank when the temperature of the coolant fluid is equal to or higher than the trigger temperature. The filling gas covers the surface of the coolant fluid to prevent hydrocarbon vapors of the coolant fluid from interacting with oxygen, thereby preventing combustion.

The filling gas may be a nonflammable, compressed gas (e.g., carbon dioxide) that is stored in a gas cylinder. The filling gas may be released from the gas cylinder and into the fluid tank in response to the temperature of the coolant fluid becoming equal to or higher than the trigger temperature. Once the filling gas is released from the gas cylinder, the fluid immersion cooling system may be reset by refilling the gas cylinder with filling gas and replacing single-use components (e.g., hot-melt thermostatic control valve) of the suppression unit.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A fluid immersion cooling system for an electronic system, the fluid immersion cooling system comprising:
    a fluid tank;
    a coolant fluid comprising a hydrocarbon dielectric fluid in the fluid tank;
    a gas cylinder storing a filling gas, the filling gas being non-flammable and having a specific gravity that is greater than that of air and oxygen; and
    a valve that opens to release the filling gas from the gas cylinder and into the fluid tank to cover a surface of the coolant fluid when a temperature of the coolant fluid is equal to or higher than a trigger temperature during operation of the electronic system,
    wherein the electronic system has one or more components immersed in the coolant fluid and the trigger temperature is set based on a flash point of the coolant fluid.

2. The fluid immersion cooling system of claim 1, further comprising:
    a temperature sensor that measures a temperature of the coolant fluid,
    wherein the valve is an electronic control valve that is actuated to an open position to release the filling gas from the gas cylinder and into the fluid tank in response to the temperature sensor indicating that the temperature of the coolant fluid is equal to or higher than the trigger temperature.

3. The fluid immersion cooling system of claim 1, wherein the valve is a thermostatic control valve that is immersed in the coolant fluid and opens to release the filling gas from the gas cylinder and into the fluid tank in response to the temperature of the coolant fluid being equal to or higher than the trigger temperature.

4. The fluid immersion cooling system of claim 3, wherein the thermostatic control valve comprises a hot-melt material that melts to release the filling gas from the gas cylinder and into the fluid tank when the temperature of the coolant fluid becomes equal to or higher than the trigger temperature.

5. The fluid immersion cooling system of claim 1, wherein the gas cylinder is immersed in the coolant fluid, and the filling gas is released in the coolant fluid in the fluid tank.

6. The fluid immersion cooling system of claim 1, wherein the filling gas comprises carbon dioxide.

7. The fluid immersion cooling system of claim 1, further comprising:
    a heat exchanger that receives cold water to cool the coolant fluid; and
    one or more pumps that circulate the coolant fluid through the fluid tank and the heat exchanger.

8. The fluid immersion cooling system of claim 1, further comprising:
    a radiator; and
    one or more pumps that circulate the coolant fluid through the fluid tank and the radiator.

9. The fluid immersion cooling system of claim 1, wherein the coolant fluid has a flash point that is lower than 250° C.

10. A method of fluid immersion cooling of an electronic system, the method comprising:
    filling a fluid tank with a coolant fluid comprising a hydrocarbon dielectric fluid;
    immersing a component of the electronic system in the coolant fluid in the fluid tank;
    monitoring a temperature of the coolant fluid during operation of the electronic system; and
    releasing a filling gas into the fluid tank to cover a surface of the coolant fluid when the temperature of the coolant fluid is equal to or higher than a trigger temperature that is set based on a flash point of the coolant fluid, wherein the filling gas is non-flammable and has a specific gravity that is greater than that of air and oxygen.

11. The method of claim 10, wherein monitoring the temperature of the coolant fluid includes monitoring the temperature of the coolant fluid using a temperate sensor, and
    wherein releasing the filling gas into the fluid tank includes actuating an electronic control valve to an open position to release the filling gas from a gas cylinder and into the fluid tank when the temperature sensor indicates that the temperature of the coolant fluid is equal to or higher than the trigger temperature.

12. The method of claim 10, wherein releasing the filling gas into the fluid tank includes opening a thermostatic control valve to release the filling gas from a gas cylinder when the temperature of the coolant fluid melts a component of the thermostatic control valve.

13. The method of claim 10, wherein releasing the filling gas into the fluid tank includes releasing the filling gas in the coolant fluid in the fluid tank.

14. The method of claim 10, wherein releasing the filling gas into the fluid tank includes releasing the filling gas above the surface of the coolant fluid in the fluid tank.

15. The method of claim 10, further comprising:
    circulating the coolant fluid through a heat exchanger and the fluid tank; and
    cooling the coolant fluid with cold water in the heat exchanger.

16. The method of claim 10, further comprising:
    circulating the coolant fluid through a radiator and the fluid tank; and
    cooling the coolant fluid by using a fan to move heat away from cooling surfaces of the radiator.

17. The method of claim 10, wherein the coolant fluid has a flash point that is lower than 250° C.

* * * * *